United States Patent
Chen et al.

(10) Patent No.: US 10,512,187 B2
(45) Date of Patent: Dec. 17, 2019

(54) ALIGNMENT DEVICE FOR ORTHOGONAL ENGAGEMENT OF LINE CARDS AND FABRIC CARDS IN A SERVER

(71) Applicant: QUANTA COMPUTER INC., Taoyuan (TW)

(72) Inventors: Chao-Jung Chen, Taoyuan (TW); Hou-Hsien Chang, Taoyuan (TW); Yaw-Tzorng Tsorng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/695,922

(22) Filed: Sep. 5, 2017

(65) Prior Publication Data
US 2019/0075674 A1    Mar. 7, 2019

(51) Int. Cl.
| H05K 7/14 | (2006.01) |
| H05K 7/20 | (2006.01) |
| H04Q 1/14 | (2006.01) |
| H01R 43/20 | (2006.01) |

(52) U.S. Cl.
CPC ......... H05K 7/1454 (2013.01); H01R 43/20 (2013.01); H04Q 1/141 (2013.01); H04Q 1/148 (2013.01); H05K 7/1461 (2013.01); H05K 7/1485 (2013.01); H05K 7/20709 (2013.01)

(58) Field of Classification Search
CPC ...... H05K 7/20; H05K 7/1445; H05K 7/1492; H05K 7/14; H05K 7/1457; H05K 1/0203; H05K 1/14; H05K 5/0026; H05K 7/1454; H05K 7/186; H05K 2201/10522; G06F 1/20; G06F 13/4068
See application file for complete search history.

(56) References Cited

U.S. PATENT DOCUMENTS

| 4,155,109 A | * | 5/1979 | Finch | H05K 7/1408 361/679.4 |
| 5,352,123 A | * | 10/1994 | Sample | H05K 1/14 361/805 |
| 6,538,899 B1 | * | 3/2003 | Krishnamurthi | H01R 12/58 361/788 |
| 7,722,359 B1 | * | 5/2010 | Frangioso, Jr. | H05K 7/20563 361/679.48 |
| 8,064,200 B1 | * | 11/2011 | West | H05K 7/20563 361/694 |

(Continued)

FOREIGN PATENT DOCUMENTS

| CN | 203423891 U | 2/2014 |
| JP | 58-072889 U1 | 5/1983 |

(Continued)

OTHER PUBLICATIONS

Extended European Search Report for EP Application No. 18153703. 6, dated May 15, 2018.

(Continued)

*Primary Examiner* — Hung S. Bui
*Assistant Examiner* — Michael A Matey
(74) *Attorney, Agent, or Firm* — Nixon Peabody LLP; Zhou Lu

(57) ABSTRACT

The present invention provides a device for aligning a plurality of line card connectors with a plurality of fabric card connectors using a lattice having a plurality of intersecting strips defining an array of framed slots.

9 Claims, 6 Drawing Sheets

(56) References Cited

U.S. PATENT DOCUMENTS

| | | | |
|---|---|---|---|
| 9,116,660 B1* | 8/2015 | Widmann | G06F 1/20 |
| 9,215,829 B2* | 12/2015 | Baba | H05K 7/1452 |
| 9,282,669 B2* | 3/2016 | Yan | H05K 7/1454 |
| 2002/0018339 A1* | 2/2002 | Uzuka | G06F 1/184 |
| | | | 361/796 |
| 2002/0180554 A1 | 12/2002 | Clark et al. | |
| 2002/0181215 A1* | 12/2002 | Guenthner | H05K 1/14 |
| | | | 361/784 |
| 2002/0181217 A1* | 12/2002 | Patriche | H05K 7/1445 |
| | | | 361/796 |
| 2005/0282427 A1* | 12/2005 | Carullo | H01R 13/629 |
| | | | 439/378 |
| 2012/0122335 A1* | 5/2012 | Costello | H04Q 1/025 |
| | | | 439/502 |
| 2015/0200474 A1 | 7/2015 | Rossman et al. | |
| 2016/0036727 A1* | 2/2016 | Loiferman | H04L 49/25 |
| | | | 370/401 |
| 2016/0149362 A1* | 5/2016 | Ritter | H04Q 1/15 |
| | | | 439/540.1 |
| 2016/0353589 A1* | 12/2016 | Fujikawa | H05K 5/0026 |
| 2017/0093065 A1 | 3/2017 | Wang et al. | |

FOREIGN PATENT DOCUMENTS

| | | |
|---|---|---|
| JP | H07325643 A | 12/1995 |
| JP | 2001196771 A | 7/2001 |
| JP | 2012004327 A | 1/2012 |

OTHER PUBLICATIONS

JP Office Action for Application No. 2018-018488, dated Oct. 16, 2018, w/ First Office Action Summary.

JP Office Action for Application No. 2018-018488, dated Feb. 19, 2019, w/ Second Office Action Summary.

TW Office Action for Application No. 106140360, dated Nov. 14, 2018, w/ First Office Action Summary.

TW Search Report for Application No. 106140360, dated Nov. 14, 2018, w/ First Office Action.

* cited by examiner

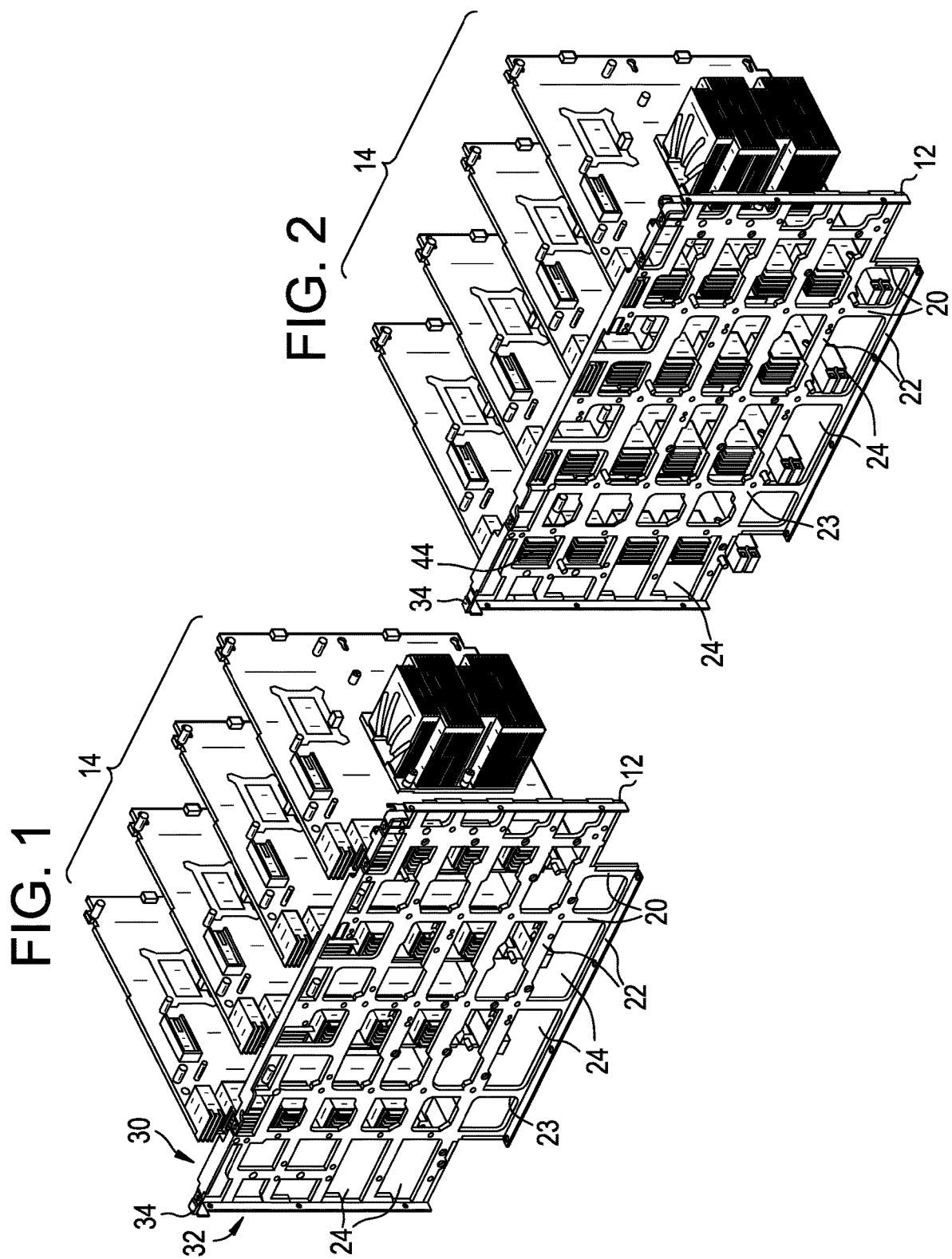

ALIGNMENT DEVICE FOR ORTHOGONAL ENGAGEMENT OF LINE CARDS AND FABRIC CARDS IN A SERVER

TECHNICAL FIELD

A device is provided for connecting line cards with fabric cards to form an electronic assembly in an enclosure and supporting the electronic assembly in an array while utilizing little space in the enclosure and allowing for optimal cooling air flow around and through the electronic assembly.

BACKGROUND

Line cards and fabric cards are well known components in carrier routing systems and computer servers for example. Carrier routing systems are typically modular in design and enable service providers to deliver data, voice, and video services over a scalable IP Next-Generation Network infrastructure. Two principal components are line cards and fabric cards that are interconnected. Line cards provide multiple tasks such as digital to analog conversion and analog to digital conversion of voice, data transfer using HTML protocols and numerous other functions well known to those of ordinary skill in the art.

Fabric cards connect the line cards with other electronic systems and act as an input and output device to avoid data collisions. An array of fabric cards and line cards are connected together to form an assembly of electronic components in a typical server and the electronic assembly is typically positioned in an enclosure. The enclosure must be cooled due to heat generated by the electronics on board the cards. Typically, cooling is accomplished through air circulated by fans through the enclosure. Prior art attempts to provide interconnectivity utilize a solid printed circuit board typically mounted in a rear of an enclosure that provides ports for connecting the line cards and ports for connecting the fabric cards and electrical pathways between the ports printed on the board with conducting material. The solid PCBs have a few drawbacks including requiring a substantial amount of space in the enclosure and serving as a barrier to cooling air circulation.

A device is disclosed for connecting and supporting line cards and fabric cards utilizing much less space than the PCBs currently being used and allowing for the circulation of cooling air through the device.

SUMMARY

One disclosed example is a device for aligning a plurality of line card connectors with a plurality of fabric card connectors using a lattice having a plurality of intersecting strips defining an array of framed slots. Each of the framed slots is dimensioned to receive a first connector element of a line card and a second connector element of a fabric card. The lattice also supports the first plurality of line cards spaced from one another along a first direction and in parallel spaced relationship, and the second plurality of fabric cards spaced from one another along a second direction generally perpendicular to the first direction and in parallel spaced relationship. The lattice has a plurality of gaps in the lattice to allow air flow through the lattice.

Another example is an assembly of electrically coupled line cards and fabric cards in an enclosure. The assembly has a first number of line cards in the enclosure and spaced from one another along a first direction and disposed in parallel spaced relationship, each of the line cards having a first plurality of a first type of electrical connectors. The assembly also has a second number of fabric cards in the enclosure and spaced from one another along a second direction and disposed in parallel spaced relationship, the second direction being generally perpendicular to the first direction, each of the fabric cards having a second plurality of a second type of electrical connectors one of each being coupled to one of each of the first type of electrical connector to form an electrical coupling. The assembly also has a lattice having a plurality of intersecting strips defining an array of framed slots, each of the electrical couplings being positioned in one of the slots and is supported therein.

Another example is a method of installing a server including the steps of: (1) providing a first number of line cards having a second number of electrical connectors; (2) providing a second number of fabric cards having a first number of electrical connectors; (3) providing a lattice having a plurality of intersecting strips defining an array of framed slots, the array of framed slots having a second number of framed slots spaced from one another along a first direction and a first number of framed slots spaced from one another along a second direction generally perpendicular to the first direction; (4) placing the first number of line cards on one side of the lattice and the second number of fabric cards on an opposite side of the lattice; (5) orienting the first number of line cards along the first direction and spaced from one another along the second direction and in parallel spaced relationship; (6) aligning each of the second number of electrical connectors with a framed slot; (7) orienting the second number of fabric cards along the second direction and spaced from one another along the first direction and in parallel spaced relationship; (8) aligning each of the first number of connectors with a framed slot; and (9) electrically coupling the second number of electrical connectors with the first number of electrical connectors through the lattice with each electrical coupling positioned in a framed slot.

BRIEF DESCRIPTION OF THE DRAWINGS

To understand the present invention, it will now be described by way of example, with reference to the accompanying drawings and attachments in which:

FIGS. 1 and 2 are perspective views of sequential steps of installing a plurality of fabric cards into a lattice.

DETAILED DESCRIPTION

Figure 4:
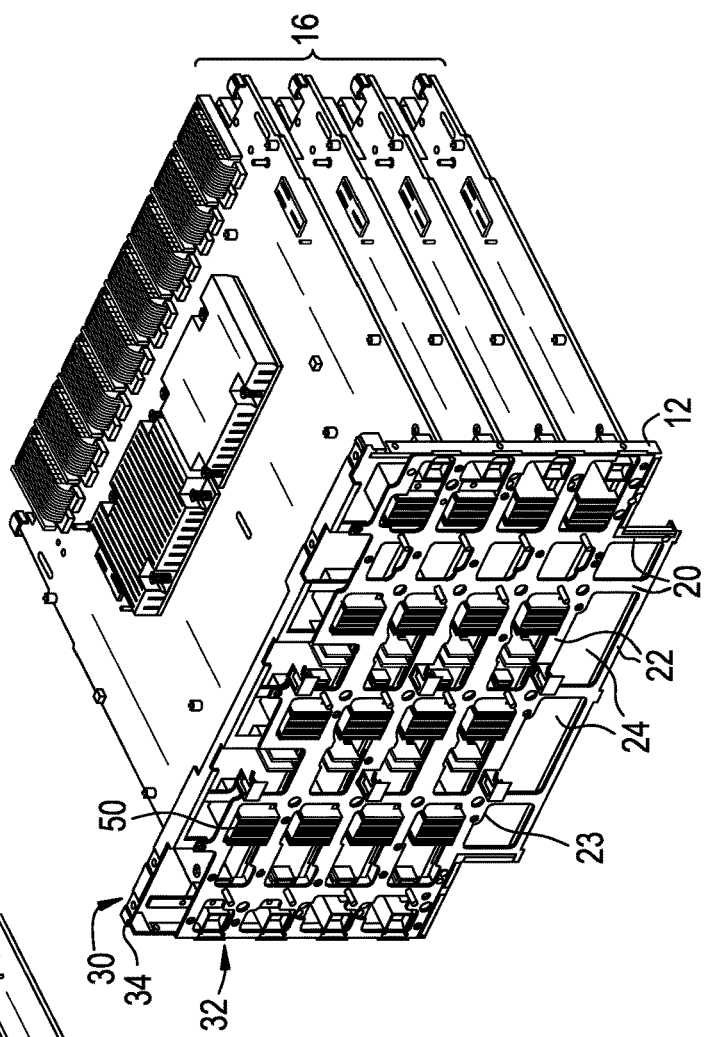
FIGS. 3 and 4 are perspective views of sequential steps of installing a plurality of line cards into a lattice.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Figure 5:
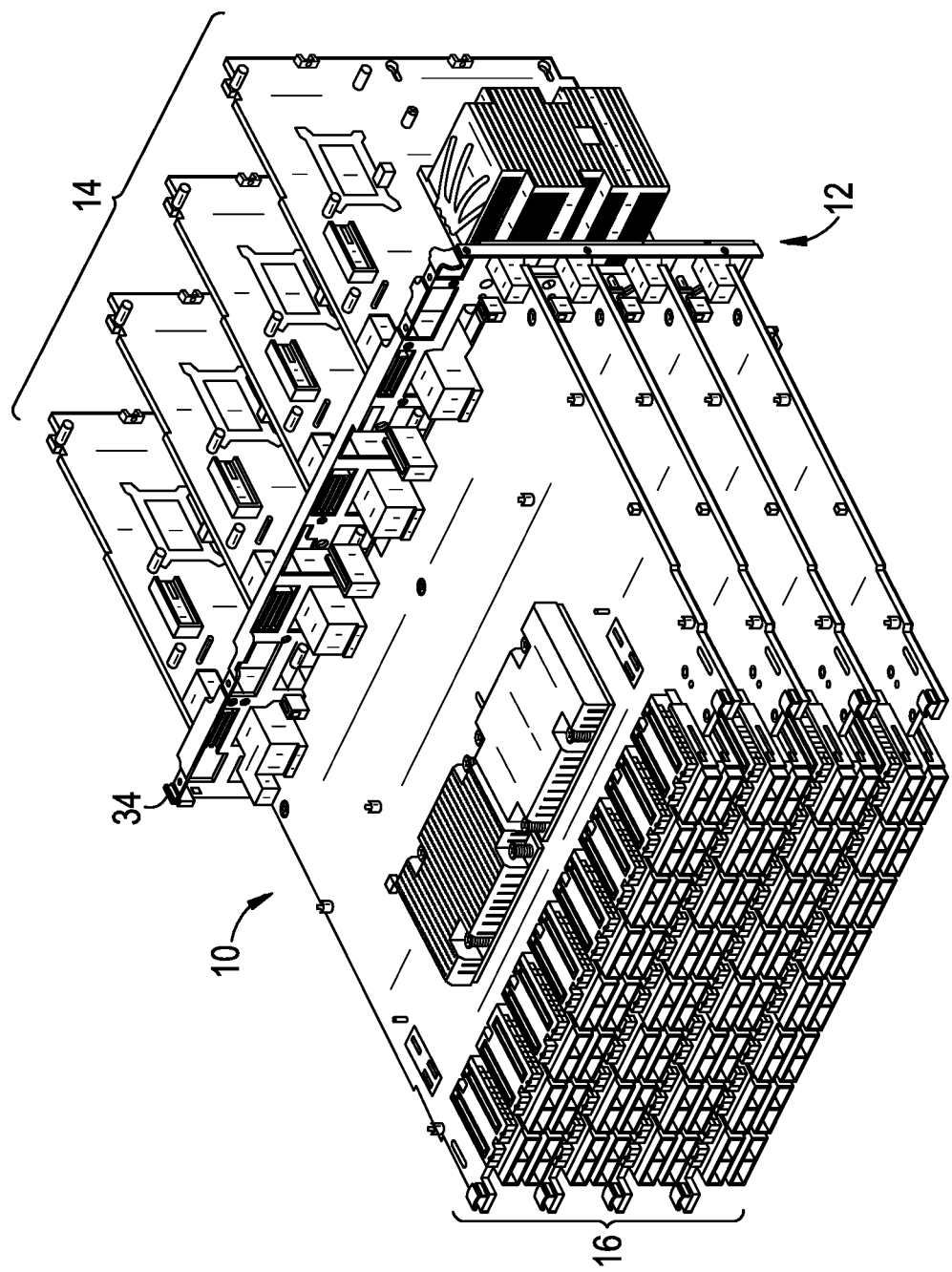
FIG. 5 is a perspective view of an electrical assembly of a plurality of fabric cards, a plurality of fabric cards and a lattice therebetween.

FIG. 5 shows a portion of a computer server or a carrier routing system having an electrical assembly 10 of a lattice 12, a plurality of fabric cards 14 and a plurality of line cards 16. The lattice 12 is positioned between the fabric cards 14 and the line cards 16 so that the fabric cards 14 attach to one side of the lattice 12 and the line cards 16 attach to the opposite side of the lattice 12. The plurality of line cards 16 extend along a first direction and are spaced along a second orthogonal direction, generally perpendicular to the first direction, and disposed in parallel spaced relationship with one another. The plurality of fabric cards 14 extend along the second direction and are spaced along the first direction in parallel spaced relationship with one another. The fabric cards 14 are electrically coupled to line cards 16. The lattice 12 does not have to be electrically conductive rather the connecting portions of the fabric and line cards extend through the thickness of the lattice 12.

FIGS. 1-5 show the lattice 12 is generally rectangular having a first plurality of strips 20 extending in a first direction and a second plurality of strips 22 extending in a second direction perpendicular to the first direction and defining a series of intersections 23 and a plurality of framed slots 24. In this example the strips 20 extend in a generally vertical direction while the strips 22 extend in a generally horizontal direction. The framed slots 24 are disposed in an array of columns 30 and rows 32.

The columns 30 extend along the second direction and are spaced from one another along the first direction. Conversely, the rows extend along the first direction and are spaced along the second direction. Four columns and four rows are shown in this example, but it is contemplated having a different number such as from 2-10 columns or rows. The number of columns 30 and rows 32 can differ in number and preferably the difference will be 2 or less. The framed slots 24 ensure proper alignment of electrical connectors 44,50 (FIGS. 5 and 9) on each of the line cards 16 and the fabric cards 14 for electrical coupling of the cards and to support the cards in proper orientation inside an enclosure (not shown). The lattice 12, also, preferably will have a connecting bracket 34 to secure the lattice 12 and the electrical assembly 10 inside an enclosure.

A detailed description of the electrical components of the line cards 16 and the fabric cards 14 is not necessary as these components can be purchased off the shelf from electrical component suppliers and are well known to those of ordinary skill in the art. Generally speaking, however, line cards 16 support a host of processors, memory components and the like for processing data, for example, to deliver data, voice, and video services over a scalable network. Fabric cards 14 act as a data bus to act as an input and output device to the line cards 16 to avoid data collisions that used to occur in earlier generations of busses and switches. Each of the line cards 16 and the fabric cards 14 has electrical connectors 50,44 respectively (FIGS. 6 and 9) of a type that will mate with one another.

It is preferred that each line card 16 and each fabric card 14 will have from 2 to 10 connectors, although the number of connectors on each type of card do not have to be equal. In a more preferred form, the line card 16 will have a number of connectors 50 equal to the number of fabric cards 14 and each fabric card 14 will have a number of connectors 44 equal to the number of line cards 16. Thus, in the electrical assembly 10, all of the line cards 16 are connected to all of the fabric cards 14. The total quantity of line card 16 connectors 50 will equal the total quantity of fabric card connectors 44.

Figure 6:
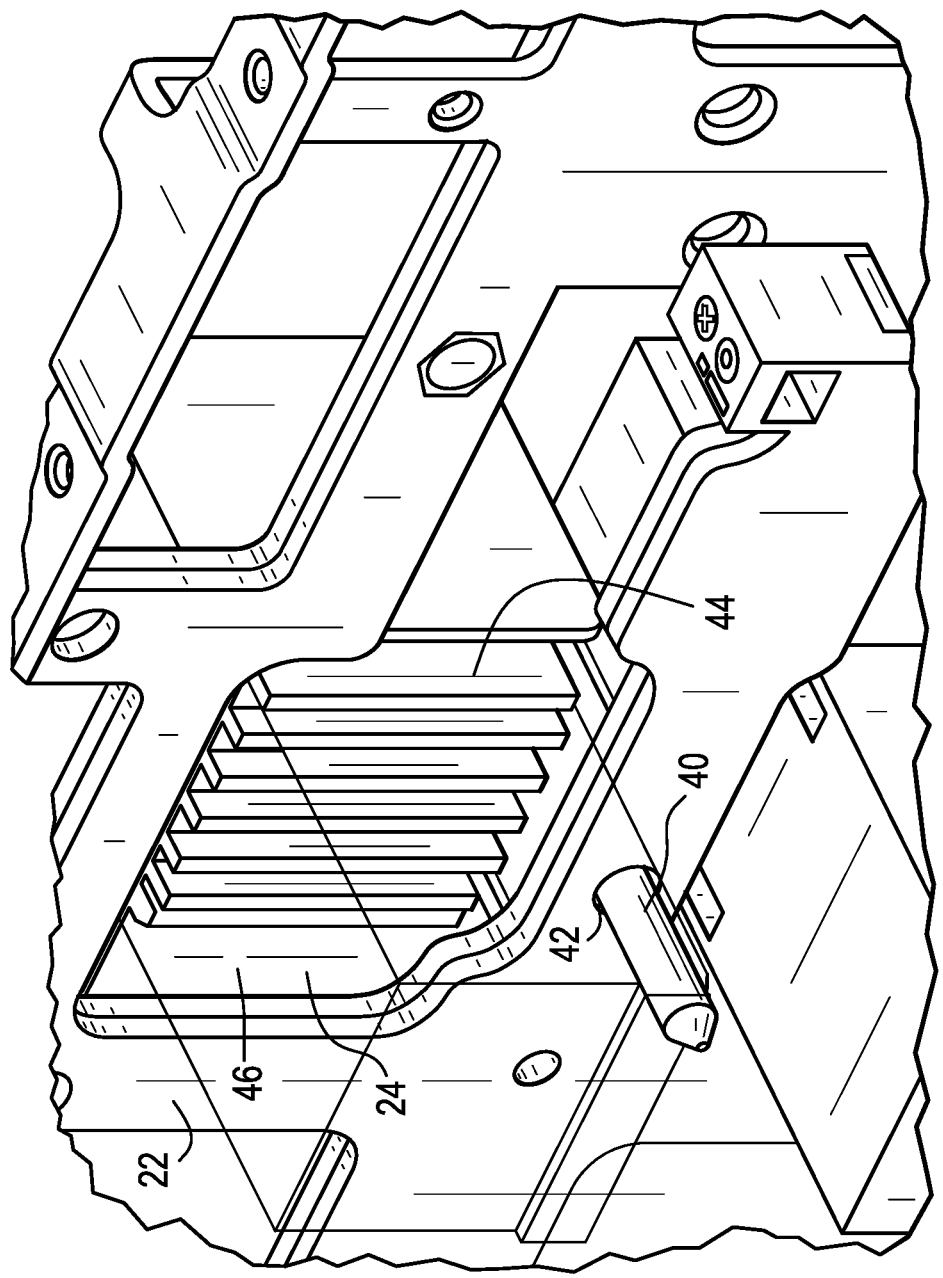
FIG. 6 is an enlarged view of a portion of a fabric card connector proximate a framed slot of the lattice.

As shown in FIG. 6, preferably each of the line cards 16 and fabric cards 14 has an alignment pin 40 for inserting through an alignment hole 42 through a strip 20,22 of the lattice 12. Any suitable number of alignment pins 40 can be provided, for example, from 1 to 10, more preferably 2 to 8, and most preferably 3 to 6, or any range or combination of ranges therein. The alignment pins 40 are for insertion into alignment holes 42 on the lattice 12 which preferably will be present in equal or greater numbers than the number of alignment pins 40. When the alignment pins 40 are inserted into the alignment holes 42, the connectors 44,50 (FIG. 9) will be positioned in the framed slots 24. Additionally, the alignment pins 40 are dimensioned to engage the alignment holes 42 to releasably attach the line cards 16 and fabrics cards 14 on opposing sides of the lattice 12. This cooperative engagement of the pins 40 and holes 42 supports and retains the line cards 16 and the fabric cards 14 in a proper position and orientation.

Figure 9:
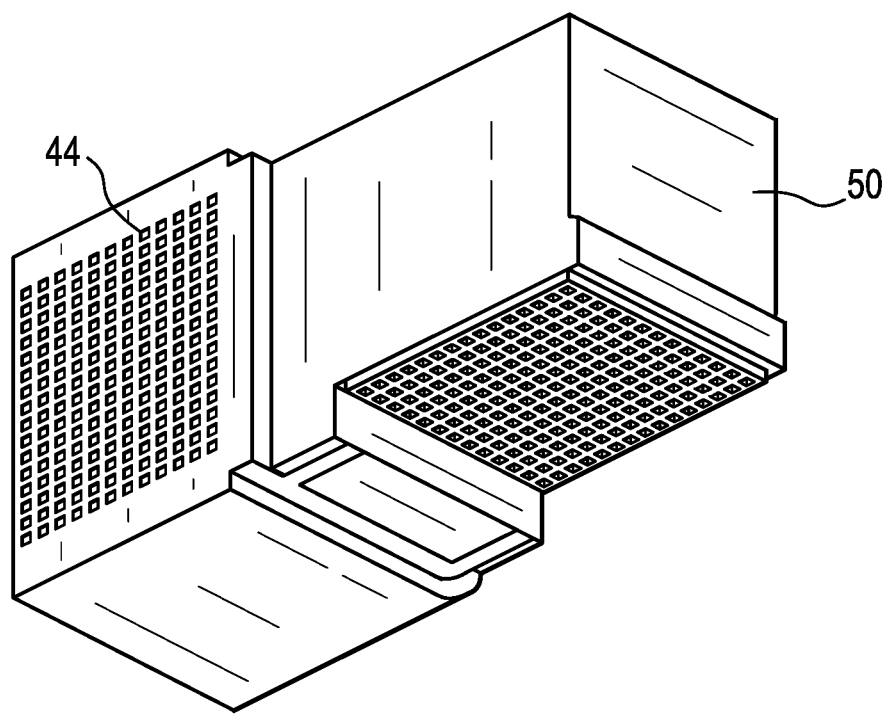
FIG. 9 is an enlarged view of a coupling of a line card and a fabric card.

FIG. 6 shows the connector 44 on a fabric card 14 positioned in a framed slot 24 and an alignment pin 40 extending from the fabric card 14 through an alignment hole 42. A gap 46 between the connector 44 and the strip 22 provides for cooling air to flow through the lattice 12 to cool the cards and the enclosure. FIGS. 5, 6 and 9 show a line card 16 connector 50 coupled to a fabric card 12 connector 44 to form an electrical coupling positioned in a framed slot 24. In one example, the electrical assembly 10 is formed from four line cards 16 and four fabric cards 14 connected together through the lattice 12. The electrical assembly 10 will be connected to a computer network (not shown). The computer network can be the Internet or a local area network or other type of electrical network well known to those of ordinary skill in the art.

Figure 8:
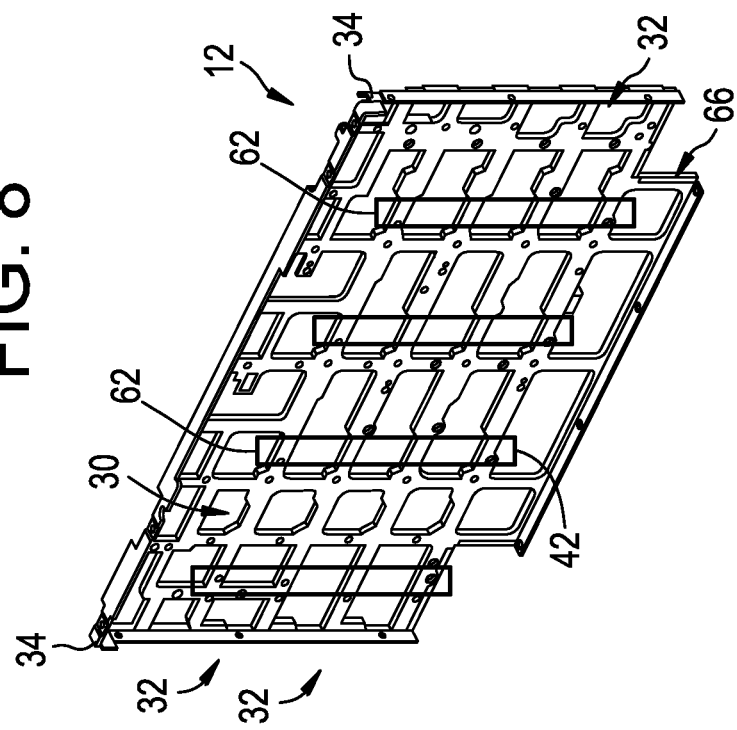
FIG. 8 is a front elevation view of the lattice showing alignment holes for the fabric cards.
Figure 7:
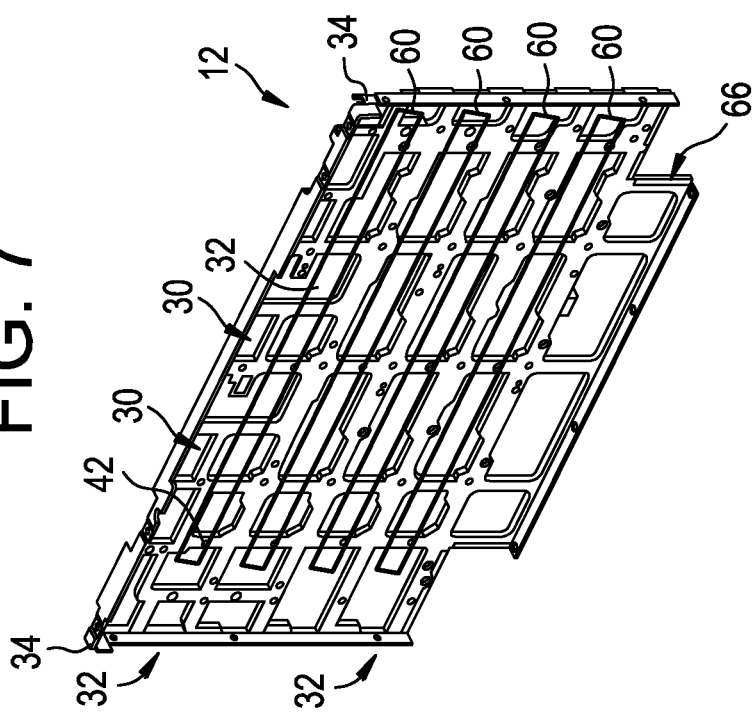
FIG. 7 is a front elevation view of the lattice showing alignment holes for line cards.

FIGS. 7 and 8 show a detailed view of the lattice 12 with the alignment holes 42 for the line cards 16 enclosed by rectangles 60 (FIG. 7), and the alignment holes 42 for the fabric card 14 enclosed in a rectangle 62 (FIG. 8). A bottom row 66 of the lattice 12 is provided for connecting the lattice 12, and connected fabric cards 14 and line cards 16 to a baseboard.

Figure 3:
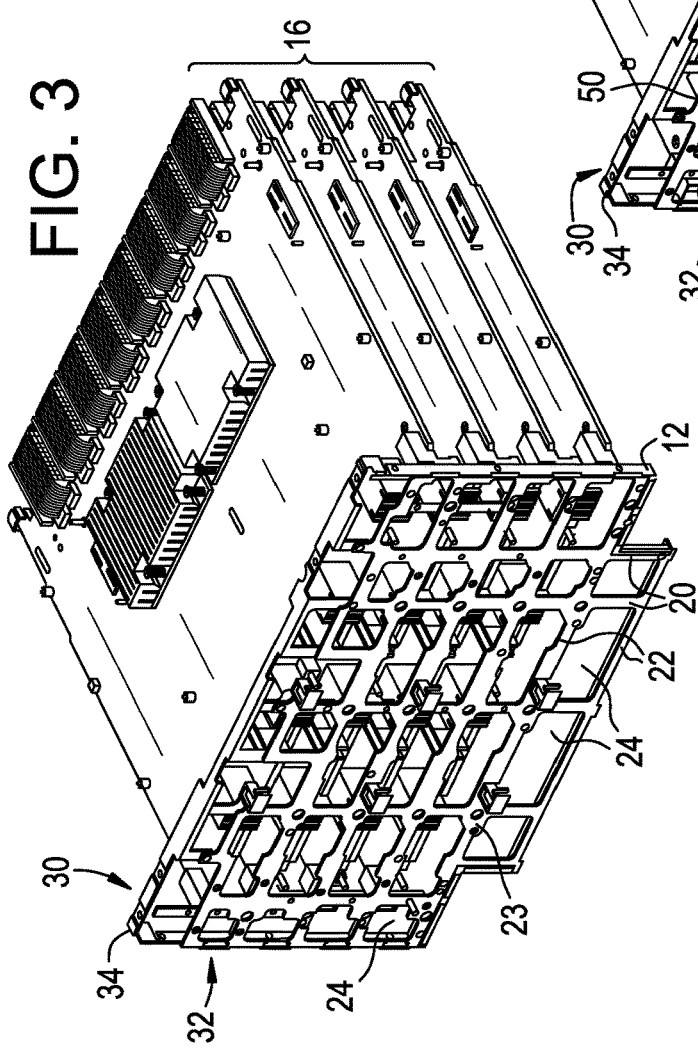

An example method for installing a server or a carrier routing systems 10 or other electronic system includes: (1) providing a first number of line cards 16 having a second number of electrical connectors 50; (2) providing a second number of fabric cards 14 having a first number of electrical connectors 44; (3) providing a lattice 12 having a plurality of intersecting strips 22 defining an array of framed slots 24, the array of framed slots 24 having a second number of framed slots spaced from one another along a first direction and a first number of framed slots spaced from one another along a second direction generally perpendicular to the first direction; (4) placing the first number of line cards 16 on one side of the lattice 12 (FIGS. 3 and 4) and the second number of fabric cards 14 on an opposite side of the lattice 12 (FIGS. 1 and 2); (5) orienting the first number of line cards 16 along the first direction and spaced from one another along the second direction and in parallel spaced relationship; (6) aligning each of the second number of electrical connectors 50 on the line cards 16 with a framed slot 24 (FIGS. 3 and 4); (7) orienting the second number of fabric cards 14 along the second direction and spaced from one another along the first direction and in parallel spaced relationship; (8) aligning each of the first number of connectors 44 on the fabric cards with a framed slot (FIGS. 1 and 2); and (9) electrically coupling the second number of electrical connectors 50 with the first number of electrical connectors 44 through the lattice 12 with each electrical coupling positioned in a framed slot 24.

When the alignment pins 40 are inserted into the alignment holes 42, the connectors (44 and 50) will be positioned in the framed slots 24. Additionally, the alignment pins 40 are dimensioned to releasably engage the alignment holes 42 to releasably attach the line cards 16 and fabric cards 14 to the lattice 12, on opposing sides of the lattice 12, and to support and retain the line cards 16 and the fabric cards 14 in a proper position and orientation.

When the alignment pins 40 are inserted into the alignment holes 42, the connectors (44 and 50) will be positioned in the framed slots 24. Additionally, the alignment pins 40 are dimensioned to releasably engage the alignment holes 42 to releasably attach the line cards 16 and fabrics cards 14 to the lattice 12, on opposing sides of the lattice 12, and to support and retain the line cards 16 and the fabric cards 14 in a proper position and orientation.

Preferably, there is an alignment pin 40 extending from each of the first number of line cards 16 and each of the second number of fabric cards 14. Any suitable number of alignment pins 40 can be provided from 1 to 10, more preferably 2 to 8, and most preferably 3 to 6, or any range or combination of ranges therein. When the alignment pins 40 are inserted into the alignment holes 42, the connectors 44 and 50 will be positioned in the framed slots 24. Additionally, the alignment pins 40 are dimensioned to releasably engage the alignment holes 42 to releasably attach the line cards 16 and fabrics cards 14 to the lattice 12, on opposing sides of the lattice 12, and to support and retain the line cards 16 and the fabric cards 14 in a proper position and orientation. Alignment holes 42 are provided through the strips 22 in equal or greater numbers when compared to the number alignment pins 40.

Many modifications and variations of the present invention are possible in light of the above teachings. It is, therefore, to be understood within the scope of the appended claims the invention may be protected otherwise than as specifically described.

What is claimed is:

1. A device for aligning a plurality of line card connectors with a plurality of fabric card connectors comprising:
    a lattice having a plurality of intersecting strips defining an array of framed slots, each of the slots dimensioned to receive a first connector element of a line card and a second connector element of a fabric card, and to support a plurality of line cards spaced from one another along a first direction and in parallel spaced relationship, and a plurality of fabric cards spaced from one another along a second direction generally perpendicular to the first direction and in parallel spaced relationship, each of the plurality of line cards having an alignment pin for inserting through one of the plurality of intersecting strips of the lattice;
    wherein the plurality of line cards comprises a first plurality of alignment pins and the plurality of fabric cards comprises a second plurality of alignment pins,
    wherein the first plurality of alignment pins and the second plurality of alignment pins are aligned with a plurality of alignment holes of the lattice such that the plurality of line cards and the plurality of fabric cards are aligned in an orthogonal manner.

2. The device of claim 1 wherein each of the plurality of line cards has a plurality of electrical connectors, one of each of the plurality of electrical connectors of the plurality of line card is for coupling with a mating electrical connector on one of each of the plurality of fabric cards.

3. The device of claim 2 wherein the number of electrical connectors of each of the plurality of line cards is equal to the number of fabric cards in the plurality of fabric cards.

4. The device of claim 1 wherein the lattice supports the line cards in a first plane and the fabric cards in a second plane generally perpendicular to the first plane.

5. The device of claim 1 further comprising a mounting bracket for attaching the lattice to a structure to support the lattice.

6. An assembly of electrically coupled line cards and fabric cards comprising:
    a first number of line cards spaced from one another along a first direction and disposed in parallel spaced relationship, each of the line cards having a first plurality of a first type of electrical connectors;
    a second number of fabric cards spaced from one another along a second direction and disposed in parallel spaced relationship, the second direction being generally perpendicular to the first direction, each of the fabric cards having a second plurality of a second type of electrical connectors one of each being coupled to one of each of the first type of electrical connector to form an electrical coupling; and
    a lattice having a plurality of intersecting strips defining an array of framed slots, each of the electrical couplings being positioned in one of the slots and supported therein,
    wherein the first number of line cards comprises a first plurality of alignment pins and the second number of fabric cards comprises a second plurality of alignment pins,
    wherein the first plurality of alignment pins and the second plurality of alignment pins are aligned with a plurality of alignment holes of the lattice such that the first number of line cards and the second number of fabric cards are aligned in an orthogonal manner.

7. The assembly of claim 6, wherein each of the first number of line cards comprises at least one of the first plurality of alignment pins, and each of the second number of fabric cards comprises at least one of the second plurality of alignment pins.

8. The assembly of claim 6 further comprising a plurality of gaps in the lattice to allow air flow through the lattice.

9. The assembly of claim 6 wherein each of the first number of line cards is electrically coupled to each of the second number of fabric cards.

* * * * *